(12) United States Patent
Alghooneh et al.

(10) Patent No.: US 9,849,379 B2
(45) Date of Patent: Dec. 26, 2017

(54) HAPTIC PERIPHERAL HAVING A DEFORMABLE SUBSTRATE CONFIGURED FOR AMPLIFIED DEFORMATION

(71) Applicant: Immersion Corporation, San Jose, CA (US)

(72) Inventors: Mansoor Alghooneh, Montreal (CA); Juan Manuel Cruz Hernandez, Montreal (CA); Vahid Khoshkava, Montreal (CA); Danny Grant, Laval (CA)

(73) Assignee: Immersion Corporation, San Jose, CA (US)

( * ) Notice: Subject to any disclaimer, the term of this patent is extended or adjusted under 35 U.S.C. 154(b) by 90 days.

(21) Appl. No.: 14/951,828

(22) Filed: Nov. 25, 2015

(65) Prior Publication Data

US 2017/0144063 A1 May 25, 2017

(51) Int. Cl.
*A63F 9/24* (2006.01)
*A63F 13/00* (2014.01)
(Continued)

(52) U.S. Cl.
CPC ............ *A63F 13/285* (2014.09); *G06F 3/016* (2013.01); *G08B 6/00* (2013.01); *H01L 41/0926* (2013.01); *H02N 2/043* (2013.01)

(58) Field of Classification Search
CPC ....................... A63F 13/285; A63F 2300/1037
See application file for complete search history.

(56) References Cited

U.S. PATENT DOCUMENTS 3,662,076 A 5/1972 Gordon et al.
4,514,726 A 4/1985 Whetstone et al.
(Continued)

FOREIGN PATENT DOCUMENTS

CN 1444758 A 9/2003
EP 1 574 934 9/2005
(Continued)

OTHER PUBLICATIONS

"Touch User Interface—Touch Screen and Multi Touch", Jun. 12, 2009; http:/www.touchuserinterface.com/2009/06/shape-changing-mobile-phone-concept.html.
(Continued)

*Primary Examiner* — Kevin Y Kim
(74) *Attorney, Agent, or Firm* — Medler Ferro Woodhouse & Mills PLLC

(57) ABSTRACT

A haptic peripheral includes a housing, a deformable substrate coupled to the housing to be moveable thereto, and a smart material actuator coupled to a surface of the deformable substrate. The smart material actuator produces a force that deforms the deformable substrate relative to the housing in response to the control signal from a processor to thereby provide a haptic effect to a user of the haptic peripheral. The deformable substrate includes at least one user contact portion configured to contact the user and two opposing hinges. The deformable substrate also includes at least two stiff arms, each stiff arm extending between the user contact portion and one of the two opposing hinges. The stiff arms are relatively stiffer than the user contact portion and the hinges such that the deformable substrate is configured to increase the deformation of the deformable substrate relative to the housing.

20 Claims, 13 Drawing Sheets

(51) Int. Cl.
| | | |
|---|---|---|
| G06F 17/00 | (2006.01) | |
| G06F 19/00 | (2011.01) | |
| A63F 13/285 | (2014.01) | |
| G08B 6/00 | (2006.01) | |
| G06F 3/01 | (2006.01) | |
| H01L 41/09 | (2006.01) | |
| H02N 2/04 | (2006.01) | |

(56) References Cited

U.S. PATENT DOCUMENTS

| | | | |
|---|---|---|---|
| 5,453,012 | A | 9/1995 | Hudecek |
| 5,772,440 | A | 6/1998 | Ida |
| 5,821,920 | A | 10/1998 | Rosenberg et al. |
| 5,844,392 | A | 12/1998 | Peurach et al. |
| 6,106,301 | A | 8/2000 | Merril |
| 6,470,302 | B1 | 10/2002 | Cunningham et al. |
| 6,641,480 | B2 | 11/2003 | Murzanski et al. |
| 6,697,043 | B1 | 2/2004 | Shahoian |
| 6,717,573 | B1 | 4/2004 | Shahoian et al. |
| 6,927,528 | B2 | 8/2005 | Barillot et al. |
| 6,929,481 | B1 | 8/2005 | Alexander et al. |
| 7,182,691 | B1 | 2/2007 | Schena |
| 7,196,688 | B2 | 3/2007 | Schena |
| 7,228,212 | B2 | 6/2007 | Hijikata et al. |
| 7,277,080 | B2 | 10/2007 | Goulthorpe |
| 7,289,106 | B2 | 10/2007 | Bailey et al. |
| 7,308,831 | B2 | 12/2007 | Cunningham et al. |
| 7,355,595 | B2 | 4/2008 | Bathiche et al. |
| 8,342,853 | B2 | 1/2013 | Cohen |
| 2002/0054060 | A1 | 5/2002 | Schena |
| 2002/0058549 | A1 | 5/2002 | Armstrong |
| 2004/0046739 | A1 | 3/2004 | Gettemy |
| 2005/0057528 | A1 | 3/2005 | Kleen |
| 2005/0219205 | A1 | 10/2005 | Bailey et al. |
| 2007/0117077 | A1 | 5/2007 | Gordon et al. |
| 2007/0152974 | A1 | 7/2007 | Kim et al. |
| 2007/0244641 | A1 | 10/2007 | Altan et al. |
| 2008/0100568 | A1 | 5/2008 | Koch et al. |
| 2008/0169911 | A1 | 7/2008 | Klinghult et al. |
| 2008/0246735 | A1 | 10/2008 | Reynolds et al. |
| 2009/0007758 | A1 | 1/2009 | Schlosser et al. |
| 2009/0085879 | A1 | 4/2009 | Dai et al. |
| 2010/0149111 | A1* | 6/2010 | Olien .............. G06F 3/016 345/173 |
| 2010/0283727 | A1 | 11/2010 | Jiang et al. |
| 2010/0283731 | A1 | 11/2010 | Grant et al. |

FOREIGN PATENT DOCUMENTS

| | | |
|---|---|---|
| JP | 2005-328270 A | 11/2005 |
| JP | 2012-526331 A | 10/2012 |
| KR | 20140112871 | 9/2014 |
| WO | 97/05592 A1 | 2/1997 |
| WO | 2008/086904 A1 | 7/2008 |
| WO | 2009/045748 A1 | 4/2009 |
| WO | 2015146116 | 10/2015 |

OTHER PUBLICATIONS

Tomohiro Amemiya et al., "Haptic Direction Indicator for Visually Impaired People Based on Pseudo-Attraction Force", International Journal on Human-Computer Interaction, vol. 1 No. 5; Mar. 2009; ISSN:1697-9613; pp. 23-34.
Tomohiro Amemiya et al., "Lead-me Interface for a Pulling Sensation from Hand-held Devices", ACM Transactions on Applied Perceptions; vol. 5 Issue 3; Article 15; Aug. 2008; pp. 15-15:17.
Tomohiro Amemiya et al., "Virtual Force Display Direction Guidance using Asymmetric Acceleration via Periodic Translational Motion", Proceedings of the First Joint Eurohaptics Conference and Symposium on Haptic Interfaces for Virtual Environment and Teleoperator Systems; 2005 IEEE, pp. 619-622.
Oliver Bau et al., "BubbleWrap: A Textile-Based Electromagnetic Haptic Display", CHI 2009: Extended Abstracts on Human Factors in Computing Systems; Apr. 4-9, 2009; pp. 3607-3612.
Fabian Hemmert et al., "Dynamic Knobs: Shape change as a means of interaction on a mobile phone", CHI 2008: Extended Abstracts on Human Factors in Computing Systems (Apr. 5-10, 2008); pp. 2309-2314.
Fabian Hemmert et al., "Shape Changing Mobiles Tapering in One Dimensional Deformational Displays in Mobile Phones", TEI 2010 Proceedings of the 4th International Conference on Tangible, Embedded and Embodied Interaction (Jan. 25, 2010); pp. 249-252.
G Michelitsch et al., "Haptic Chameleon: A New Concept of Shape-Changing User Interface Controls with Force Feedback", CHI 2004: Extended Abstracts on human factors in computing systems (Apr. 24-29, 2004); pp. 1305-1308.
Norio Nakamura et al., "An Innovative Non-Grounding Haptic Interface 'GyroCubeSensuous' displaying Illusion Sensation of Push, Pull and Lift", National Institute of Advance Industrial Science and Technology; ACM; Jul. 31, 2005.
Norio Nakamura et al., "Development of a Force and Torque Hybrid Display 'GyroCubeStick'", Second Joint EuroHaptics Conference and Symposium on Haptic Interfaces for Virtual Environment and Teleoperator Systems; 2005 IEEE; pp. 633-634.
Norio Nakamura et al., "Development of Fingertip Type Non-grounding Force Feedback Display", WHC'07 Proceedings of the Second Joint EuroHaptics Conference and Symposium on Haptic Interfaces for Virtual Environment and Teleoperator Systems; 2007 IEEE; pp. 582-583.
William R. Provancher, "Creating Greater VR Immersion by Emulating Force Feedback with Ungrounded Tactile Feedback"; IQT Quarterly vol. 6 No. 2; 2014; pp. 18-21.
Colin Swindells et al., "TorqueBAR: An Ungrounded Haptic Feedback Device"; ICMI '03: Proceedings of the 5th international conference on Multimodal interfaces; 2003, pp. 52-59.
Hiroaki Yano et al., "Development of Non-grounded Haptic Interface Using the Gyro Effect", Proceedings of the 11th Symposium on Haptic Interfaces for Virtual Environment and Teleoperator Systems; 2003 IEEE; pp. 1-8.
Extended European Search Report issued in EP Application No. 16204276.6, dated May 12, 2017.
Extended European Search Report issued in EP Application No. 16198135.2, dated May 31, 2017.

* cited by examiner

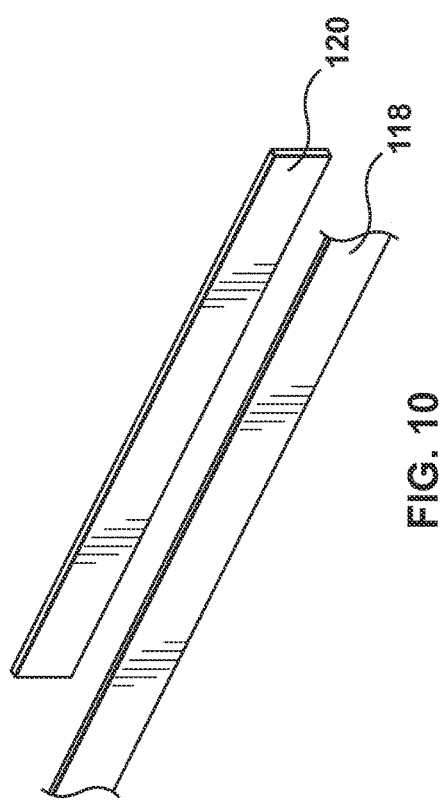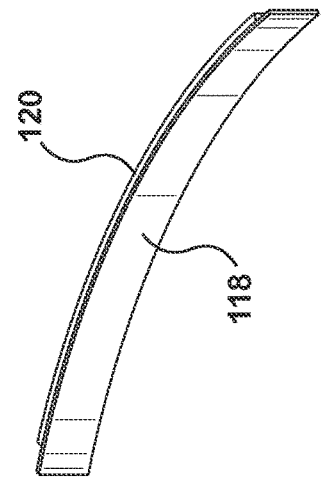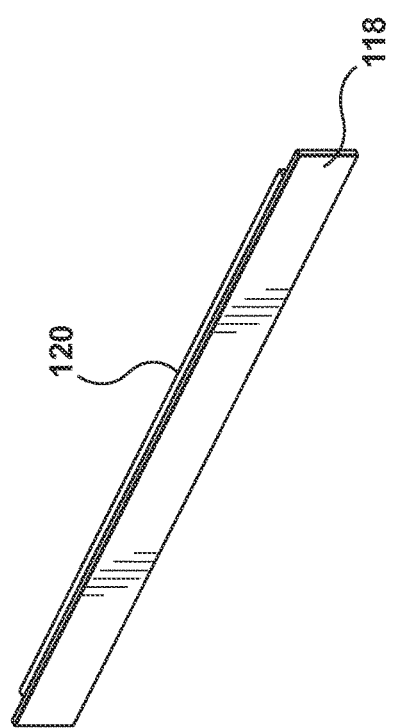

HAPTIC PERIPHERAL HAVING A DEFORMABLE SUBSTRATE CONFIGURED FOR AMPLIFIED DEFORMATION

FIELD OF THE INVENTION

Embodiments hereof relate to haptic effects and more particularly relates to a haptic peripheral having a deformable substrate configured for amplified deformation to provide haptic effects to a user.

BACKGROUND OF THE INVENTION

Video games and video game systems have become even more popular due to the marketing toward, and resulting participation from, casual gamers. Conventional video game devices or controllers use visual and auditory cues to provide feedback to a user. In some interface devices, kinesthetic feedback (such as active and resistive force feedback) and/or tactile feedback (such as vibration, texture, and heat) is also provided to the user, more generally known collectively as "haptic feedback" or "haptic effects". Haptic feedback can provide cues that enhance and simplify the user interface. Specifically, vibration effects, or vibrotactile haptic effects, may be useful in providing cues to users of electronic devices to alert the user to specific events, or provide realistic feedback to create greater sensory immersion within a simulated or virtual environment.

Other devices, such as medical devices, automotive controls, remote controls, and other similar devices wherein a user interacts with a user input elements to cause an action also benefit from haptic feedback or haptic effects. For example, and not by way of limitation, user input elements on medical devices may be operated by a user outside the body of a patient at a proximal portion of a medical device to cause an action within the patient's body at a distal end of the medical device. Haptic feedback or haptic effects may be employed devices to alert the user to specific events, or provide realistic feedback to user regarding interaction of the medical device with the patient at the distal end of the medical device.

Conventional haptic feedback systems for gaming, virtual reality, and other devices generally include one or more actuators attached to or contained within the housing of the controller/peripheral for generating the haptic feedback. One problem occurring in commercially-available implementations of haptic feedback devices is that the devices are very bulky because such devices employ large motors and require large power supplies to operate. These features make it difficult to integrate compelling haptic feedback into a smaller interface device such as a handheld gamepad, joystick, remote control, or other device. Yet, these controllers are preferred input devices for many types of systems, especially home video game consoles, and are also preferred by many consumers.

Embodiments hereof relate to a haptic feedback system that provides a deformation haptic effect via a smaller interface device such as a handheld peripheral for a gaming system.

BRIEF SUMMARY OF THE INVENTION

Embodiments hereof are directed to a haptic peripheral that includes a housing, a deformable substrate coupled to the housing to be moveable thereto, and a smart material actuator coupled to a surface of the deformable substrate. The deformable substrate includes at least one user contact portion configured to contact the user and two opposing hinges. The smart material actuator is configured to receive a control signal from a processor and is configured to produce a force that deforms the deformable substrate relative to the housing in response to the control signal from the processor to thereby provide a haptic effect to a user of the haptic peripheral. The deformable substrate includes at least two stiff arms, each stiff arm extending between the user contact portion and one of the two opposing hinges. The stiff arms are relatively stiffer than the user contact portion and the hinges such that the deformable substrate is configured to increase the deformation of the deformable substrate relative to the housing.

According to another embodiment hereof, a haptic peripheral includes a housing, a deformable substrate coupled to the housing to be moveable thereto, and a smart material actuator coupled to a surface of the deformable substrate. The smart material actuator is configured to receive a control signal from a processor and is configured to produce a force that deforms the deformable substrate relative to the housing in response to the control signal from the processor to thereby provide a haptic effect to a user of the haptic peripheral. At least a first portion of the deformable substrate is stiffer than a second portion of the deformable substrate such that the deformable substrate is configured to increase the deformation of the deformable substrate relative to the housing.

According to another embodiment hereof, a gaming system includes a host computer, a processor, and a haptic peripheral. The haptic peripheral includes a housing, a deformable substrate coupled to the housing to be moveable thereto, and a smart material actuator coupled to a surface of the deformable substrate. The smart material actuator is configured to receive a control signal from a processor and is configured to produce a force that deforms the deformable substrate relative to the housing in response to the control signal from the processor to thereby provide a haptic effect to a user of the haptic peripheral. The deformable substrate includes at least one user contact portion configured to contact the user, two opposing hinges, and at least two stiff arms, each stiff arm extending between the user contact portion and one of the two opposing hinges. The stiff arms are relatively stiffer than the user contact portion and the hinges such that the deformable substrate is configured to increase the deformation of the deformable substrate relative to the housing.

BRIEF DESCRIPTION OF DRAWINGS

The foregoing and other features and advantages of the invention will be apparent from the following description of embodiments hereof as illustrated in the accompanying drawings. The accompanying drawings, which are incorporated herein and form a part of the specification, further serve to explain the principles of the invention and to enable a person skilled in the pertinent art to make and use the invention. The drawings are not to scale.

FIG. 10 is an exploded perspective view of a portion of the deformable substrate of FIG. 4 and a smart material or piezoelectric actuator.

FIG. 10A is a perspective view of the components of FIG. 10 coupled together.

FIG. 10B is a perspective view of FIG. 10A after producing an electric charge and bending in response thereto.

DETAILED DESCRIPTION OF THE INVENTION

Specific embodiments of the present invention are now described with reference to the figures, wherein like reference numbers indicate identical or functionally similar elements.

The following detailed description is merely exemplary in nature and is not intended to limit the invention or the application and uses of the invention. Furthermore, there is no intention to be bound by any expressed or implied theory presented in the preceding technical field, background, brief summary or the following detailed description. Furthermore, although the following description is directed to gaming devices and controllers for gaming devices, those skilled in the art would recognize that the description applies equally to other haptic feedback devices.

Embodiments hereof relate to a haptic peripheral of a haptic feedback system, the haptic peripheral including a housing, a deformable substrate coupled to the housing to be moveable thereto, and a smart material actuator coupled to a surface of the deformable substrate. The smart material actuator is configured to receive a control signal from a processor and is configured to produce a force that deforms the deformable substrate relative to the housing in response to the control signal from the processor to thereby provide a haptic effect to a user of the haptic peripheral. The deformable substrate is configured to amplify or increase the deformation of the deformable substrate relative to the housing. More particularly, at least a first portion of the deformable substrate is stiffer than a second portion of the deformable substrate such that the deformable substrate is configured to increase the deformation of the deformable substrate relative to the housing. The haptic peripheral is thus a graspable device that utilizes a solid substrate and smart material actuators to provide amplified deformation and haptics sensations that significantly improve the quality of user experience in virtual reality and video gaming interactions. Advantages of haptic peripherals described herein include that the deformable substrate is very thin (i.e., less than 2 mm thickness), is light weight (i.e., less than 20 grams), the smart material actuation is quiet, the smart material actuation is low power, the smart material actuation operates in a broad range of frequencies (0.1 to 1 Khz), and the smart material actuation delivers smooth sinusoidal deformation and/or sharp deformation for up to 5 mm.

Figure 1:
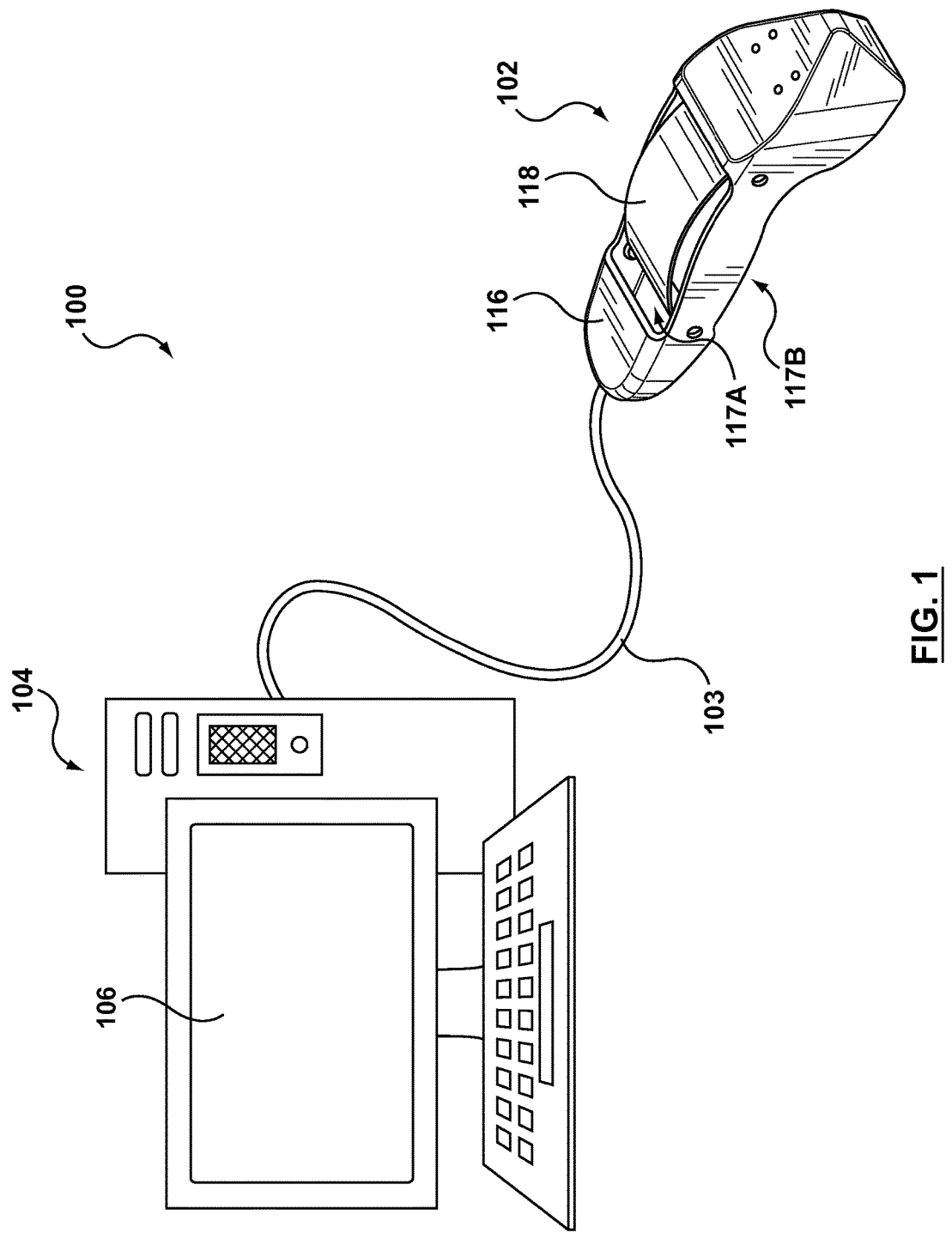
FIG. 1 is a schematic illustration of a system including a haptic peripheral according to an embodiment hereof, wherein the system also includes a host computer and display.
Figure 2:
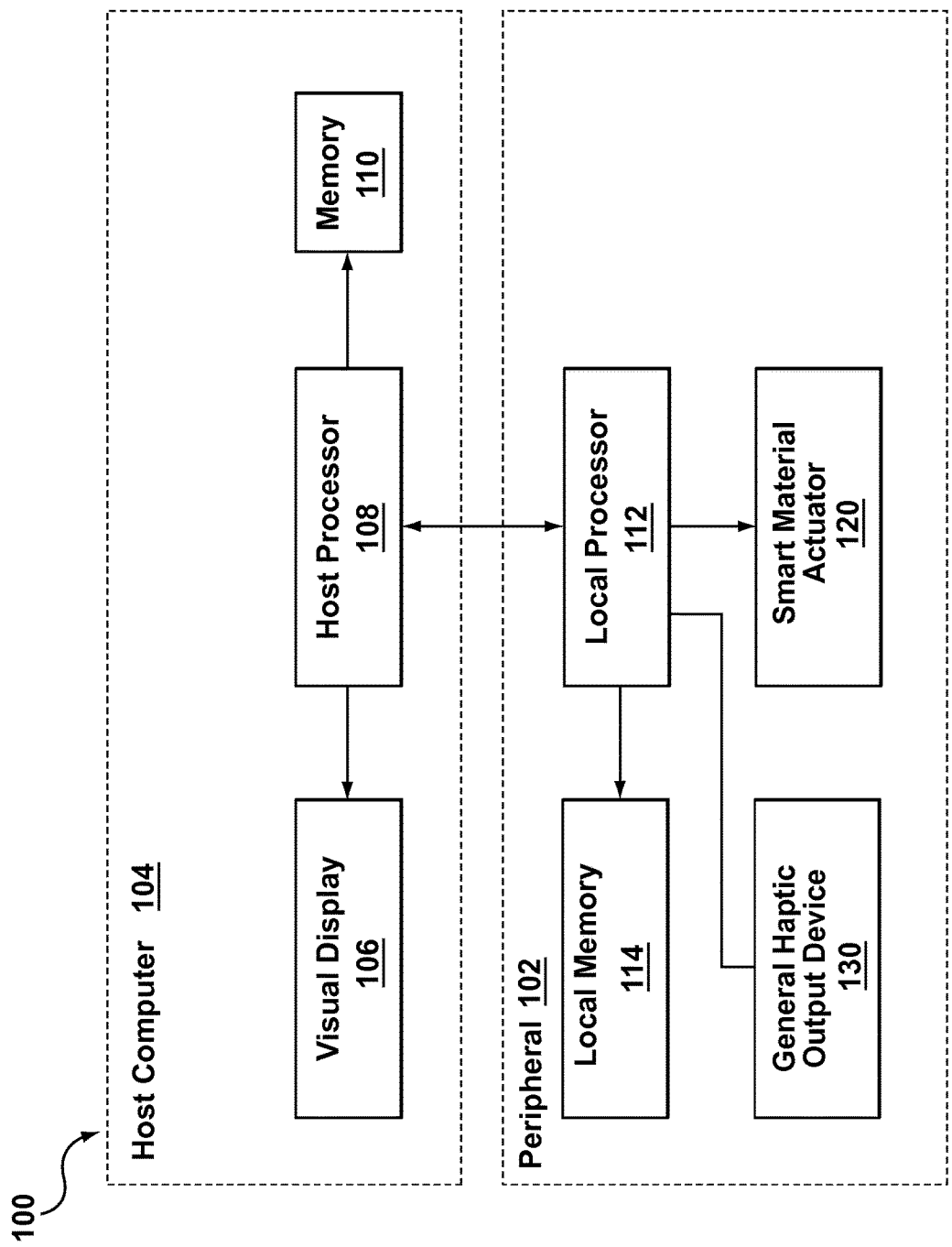
FIG. 2 is a block diagram of the system of FIG. 1.

More particularly, with reference to the figures, FIG. 1 is a schematic illustration of a haptic feedback system 100 including a haptic peripheral 102, a host computer 104, and a display 106. FIG. 2 is a block diagram of the system of FIG. 1. Haptic peripheral 102 is in communication with host computer or computer system 104 that is configured to generate a virtual environment to a user on video or visual display 106. Host computer 104 may include a video game console, mobile device, or any other type of computer system that contains a processor configured to generate a virtual environment to a user on a display. As shown in the block diagram of FIG. 2, host computer 104 includes a host processor 108, a memory 110, and visual display 106. Host computer 104 executes a software application that is stored in memory 110 and is executed by host processor 108. Host processor 108 may be any type of general purpose processor, or could be a processor specifically designed to provide haptic effect signals. Host processor 108 may be the same processor that operates the entire host computer 104, or may be a separate processor. Host processor 108 can decide what haptic effects to send to haptic peripheral 102 and in what order to send the haptic effects. Memory 110 may be any type of storage device or computer-readable medium, such as but not limited to random access memory (RAM) or read-only memory (ROM). Memory 110 may also be located internal to the host processor, or any combination of internal and external memory.

Host computer 104 is coupled to visual display 106 via wired or wireless means. Visual display 106 may be any type of medium that provides graphical information to a user; this includes but is not limited to monitors, television screens, plasmas, LCDs, projectors, head-mounted displays, virtual reality displays, or any other display devices. In an embodiment, host computer 104 is a gaming device console and visual display 106 is a monitor which is coupled to the gaming device console, as known in the art. In another embodiment, as known to those skilled in the art, host computer 104 and visual display 106 may be combined into a single device.

In the embodiment shown in FIGS. 1-2, host computer 104 is in communication with haptic peripheral 102 through a wired or USB connection 103. However, in other embodiments, haptic peripheral 102 may communicate with host computer 104 using other wired communication or wireless communication means known to those of skill in the art. This can include but is not limited to a serial or Bluetooth connection. Further, host computer 104 may be in the cloud and thus is not required to be wired or connected wirelessly in a local fashion.

As shown in the block diagram of FIG. 2, haptic peripheral 102 includes a local processor 112 which communicates with host computer 104 via connection 103, a local memory 114, a smart material or piezoelectric actuator 120, and a general haptic output device 130, although the general haptic output device is not required in all embodiments as will be described in more detail herein. In operation, local processor 112 is coupled to smart material actuator 120 and general haptic output device 130 to provide control signals thereto based on high level supervisory or streaming commands from host computer 104. For example, when in operation, voltage magnitudes and durations are streamed from host computer 104 to haptic peripheral 102 where information is provided to smart material actuator 120 and general haptic output device 130 via local processor 112. Host computer 104 may provide high level commands to local processor 112 such as the type of haptic effect to be output (e.g. vibration, jolt, detent, pop, etc.) by smart material actuator 120 and/or general haptic output device 130, whereby the local processor 112 instructs smart material actuator 120 and/or general haptic output device 130 as to particular characteristics of the haptic effect which is to be output (e.g. magnitude, frequency, duration, etc.). Local processor 112 may retrieve the type, magnitude, frequency, duration, or other characteristics of the haptic effect from a local memory 114 coupled thereto (shown in the block diagram of FIG. 2). In addition, similar to memory 110 of host computer 104, local memory 114 that can be any type of storage device or computer-readable medium, such as but not limited to random access memory (RAM) or read-only memory (ROM). Local memory 114 may also be located internal to the local processor, or any combination of internal and external memory. Similar to host processor 108, local processor 112 also can decide what haptic effects to send and what order to send the haptic effects. In addition, local processor 112 can decide which haptic output device (i.e., smart material actuator 120 or general haptic output device 130) will receive the control signal. In another embodiment hereof, haptic peripheral 102 is configured to not include local processor 112, whereby all input/output signals from haptic peripheral 102 are handled and processed directly by host computer 104.

Figure 14:
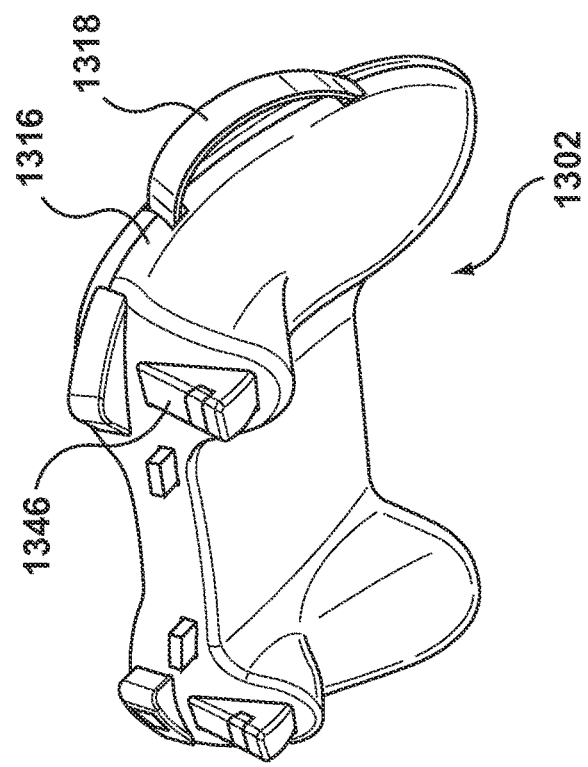
FIG. 14 is another perspective view of the haptic peripheral of FIG. 13.
Figure 13:
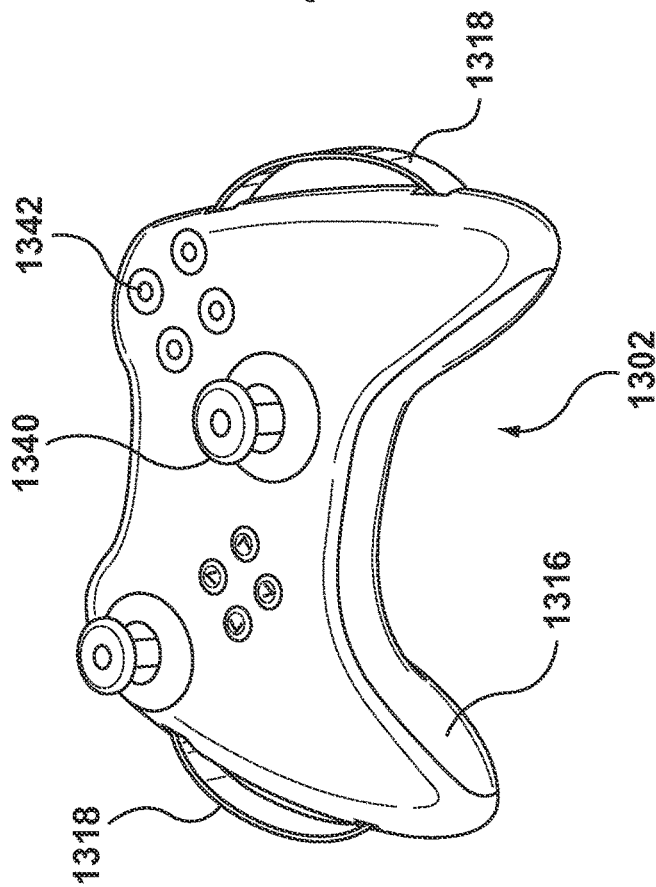
FIG. 13 is a perspective view of a haptic peripheral according to another embodiment hereof, wherein the haptic peripheral is a gaming controller that includes a deformable substrate for providing haptic effects to a user.
Figure 15:
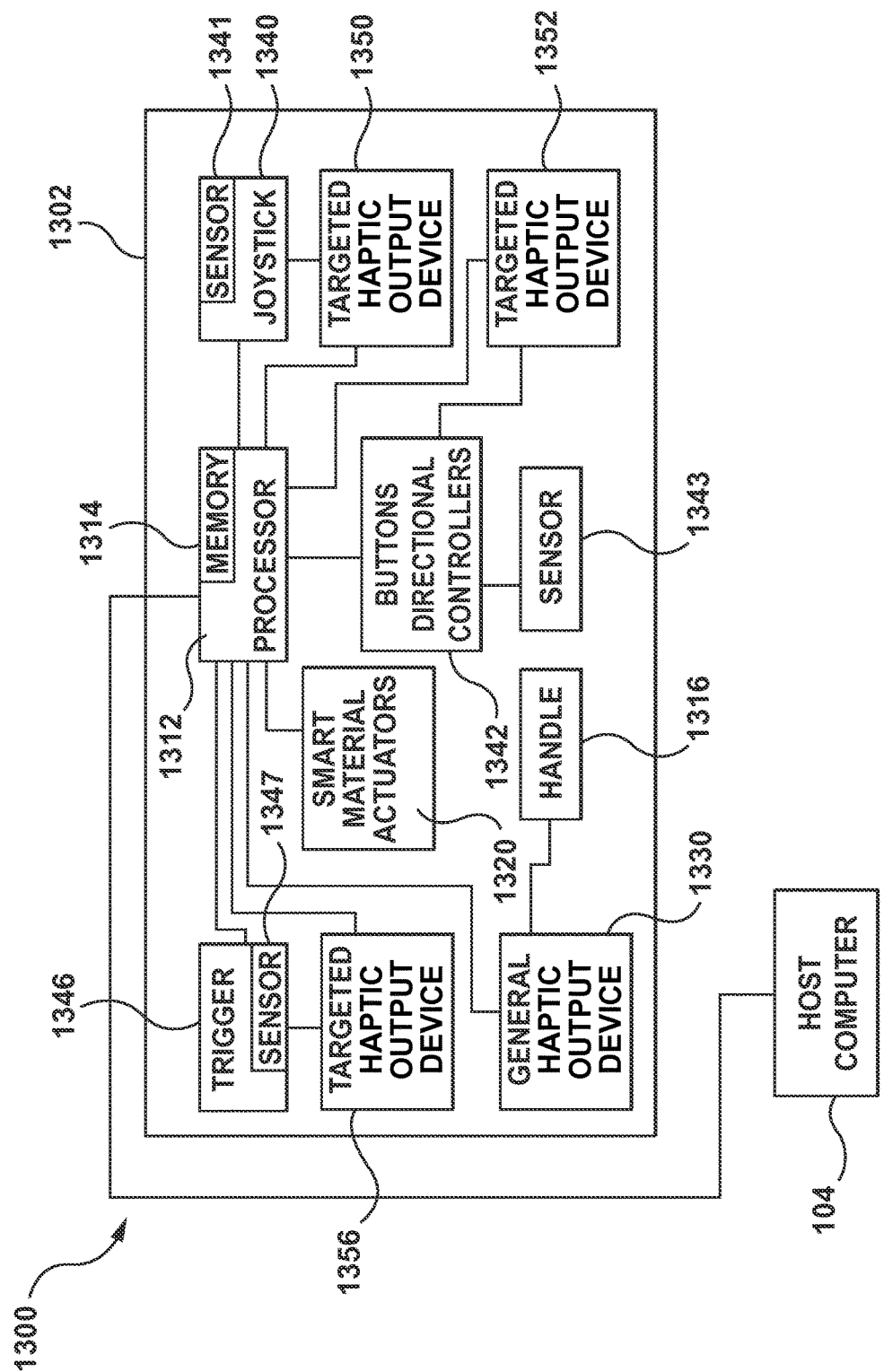
FIG. 15 is a block diagram of the haptic peripheral of FIG. 13 in conjunction with a host computer.
Figure 16:
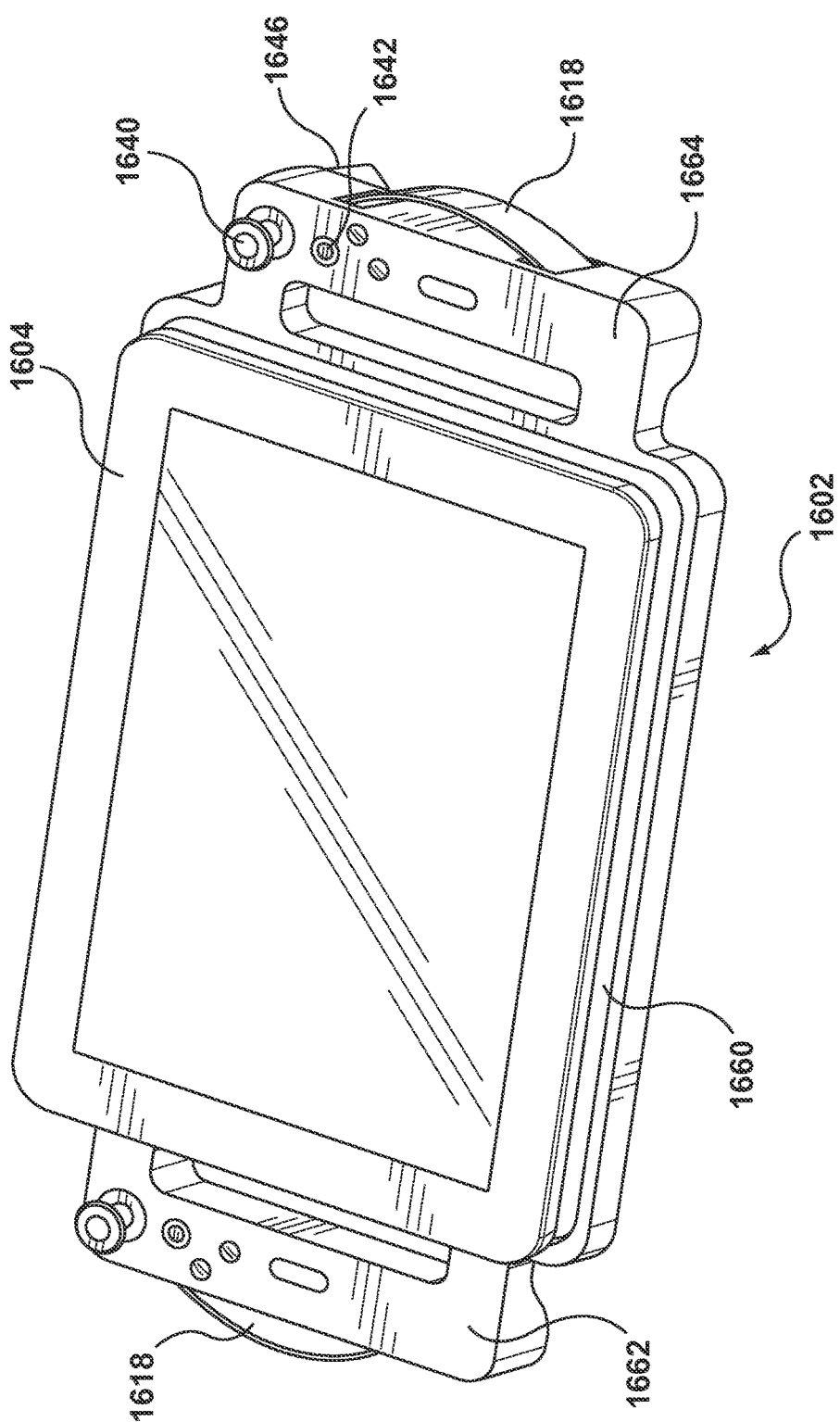
FIG. 16 is a perspective view of a haptic peripheral according to another embodiment hereof, wherein the haptic peripheral is a gaming tablet that includes a deformable substrate for providing haptic effects to a user.
Figure 17:
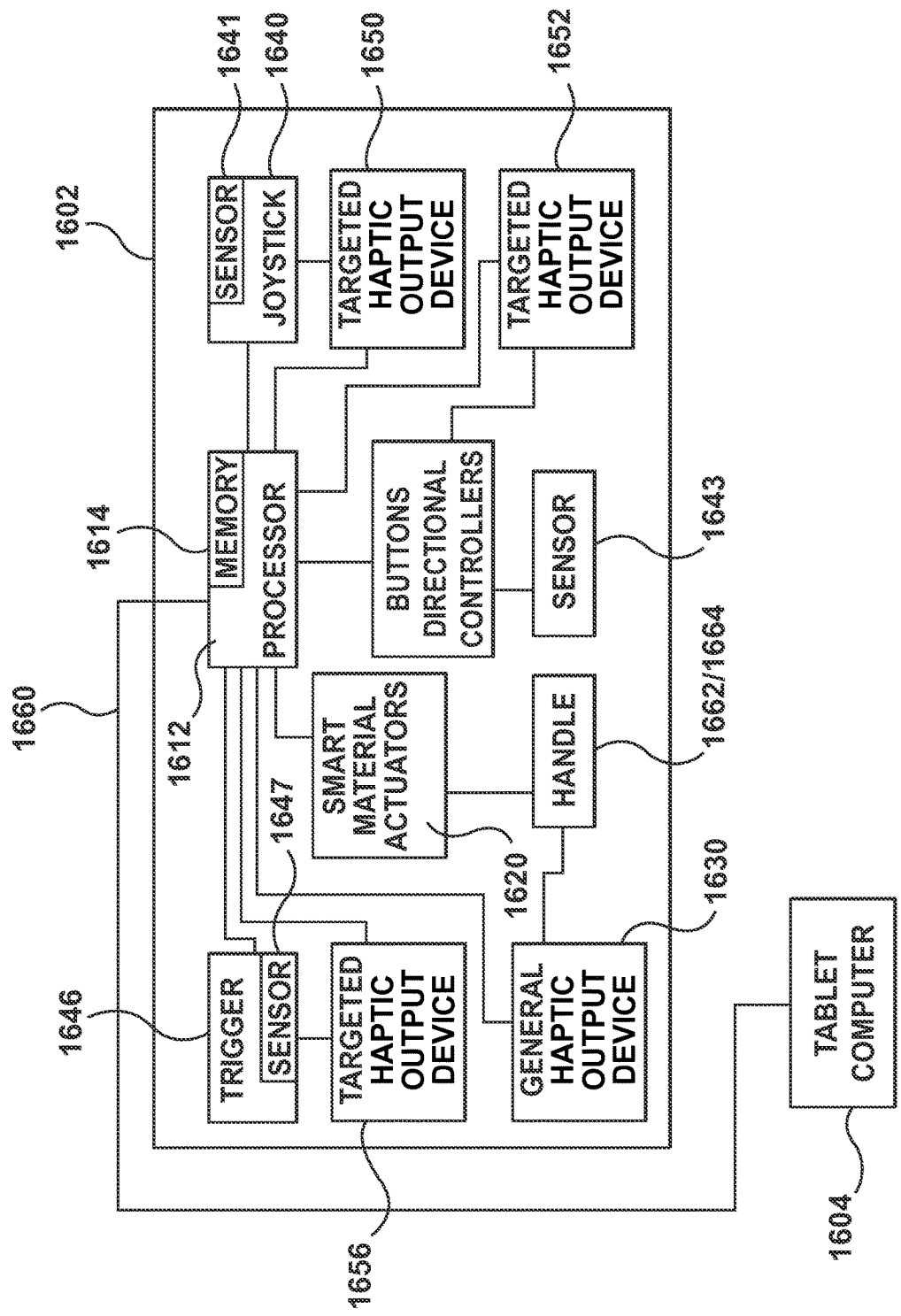
FIG. 17 is a block diagram of the gaming table of FIG. 16.

In the embodiment of FIGS. 1-2, haptic peripheral 102 is a graspable device (i.e., a device that is configured to be grasped by a hand or palm of a user). Further, haptic peripheral 102 is configured to output haptic effects as will be described in more detail herein but in this embodiment does not include a user input element or manipulandum used to input actions or otherwise interact with the video game and update the virtual environment as known in the art. However, those skilled in the art would recognize that haptic peripheral 102 may be modified to include one or more user input elements or manipulandums. Movements of user input elements or manipulandums represent inputs from the user which allows the user to interact with the software applications running on host computer 104, including but not limited to video games relating to first person shooter, third person character interaction, vehicle related games, or computer simulations. Movements of user input elements or manipulandums may provide host computer 104 with input corresponding to the movement of a computer generated graphical object, such as a cursor or other image, or some other graphical object displayed by the host computer 104 via visual display 106, or to control a virtual character or gaming avatar, such as a person, vehicle, or some other entity that may be found in a game or computer simulation. Further, those skilled in the art would recognize that haptic peripheral 102 is merely an exemplary embodiment of a haptic peripheral and that haptic peripherals with other configurations, shapes, and sizes may be used. For example, as will be described in more detail herein, the haptic peripheral may be a handheld gaming controller 1302 for a gaming system as shown in FIGS. 13-15 which is of similar shape and size to many "gamepads" currently available for video game console systems, a haptic peripheral 1602 that may be used with a tablet computer 1604 as shown in FIGS. 16-17, or other controllers such as, but not limited to, mobile phones, personal digital assistants (PDA), tablets, computers, gaming peripherals, and other controllers for virtual reality systems known to those skilled in the art.

Figure 3:
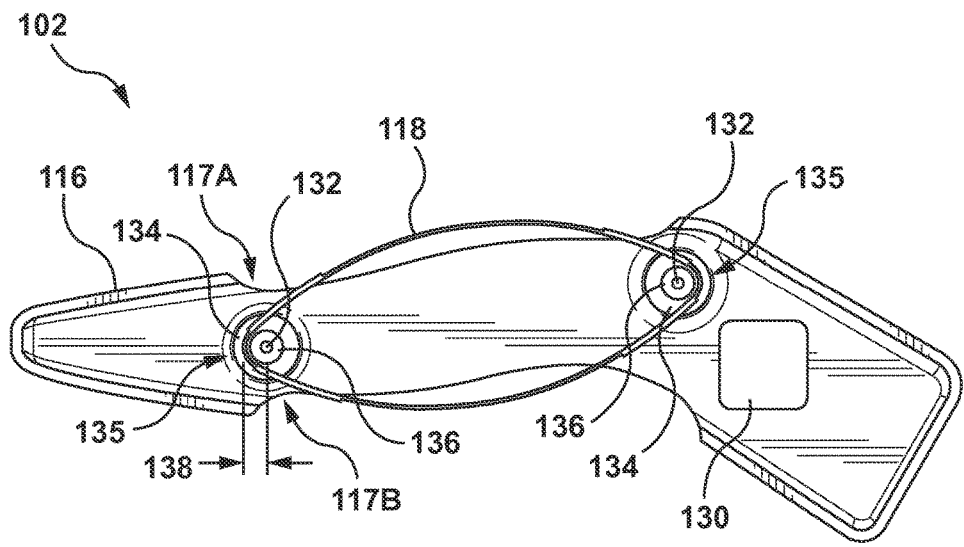
FIG. 3 is a sectional view of the haptic peripheral of FIG. 1 to illustrate the internal components thereof, wherein a deformable substrate of the haptic peripheral is a parallelogram shaped into an oval.
Figure 4:
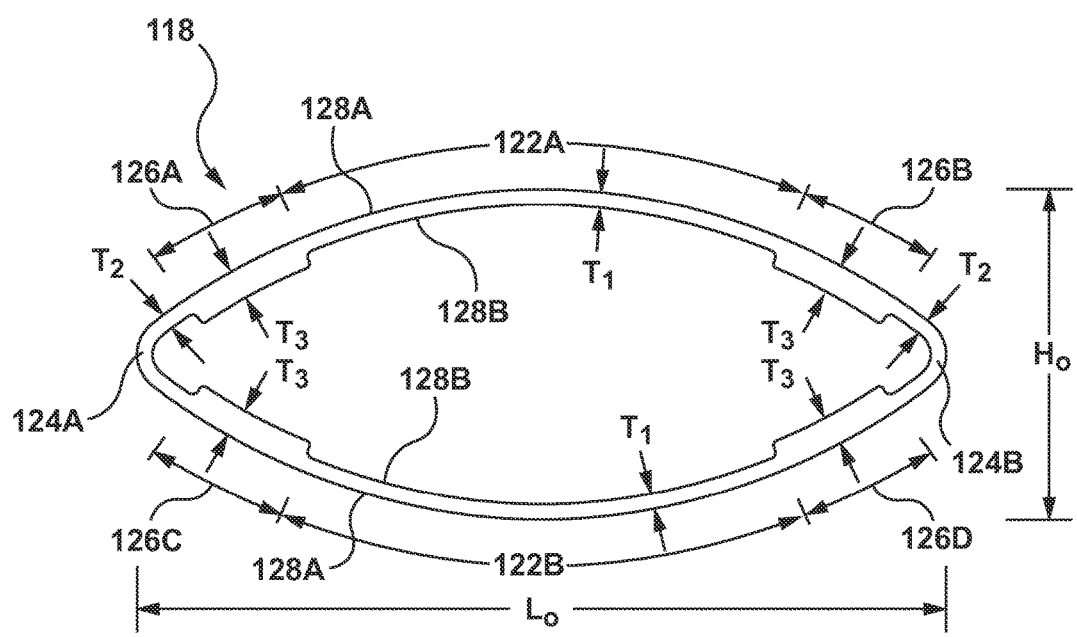
FIG. 4 is a cross-section of the deformable substrate of the haptic peripheral of FIG. 3.

FIG. 3 is a sectional view of haptic peripheral 102 to illustrate the internal components thereof. More particularly, haptic peripheral 102 includes a housing or case 116, a deformable substrate 118, and a smart material actuator 120 coupled to deformable substrate 118. In this embodiment, as will be described in more detail herein, deformable substrate 118 is a strip or parallelogram shaped into an oval or ellipse such that deformable structure has an oval or elliptical cross-section. Deformable substrate 118 is formed from a composite material such as glass fiber, carbon fiber, or other reinforced composites or other polymeric or metallic materials having a relatively high modulus that yields strength while also being sufficiently flexible to deform. In an embodiment, deformable substrate 118 may be formed from an engineering polymer and/or nanocomposites. Deformable substrate 118 as shown in FIG. 4, in which the oval shape has a nominal or first height $H_O$ and a nominal or first width or length $L_O$, may be considered the nominal or preset configuration of deformable substrate 118 in which no forces are applied thereto.

Smart material or piezoelectric actuators 120 will now be described in more detail with respect to FIG. 10, FIGS. 10A, and 10B. FIG. 10 is an exploded perspective view of a portion of deformable substrate 118 and a smart material actuator 120. FIG. 10A is a perspective view of the components of FIG. 10 coupled together, and FIG. 10B is a perspective view of FIG. 10A after bending in response to an applied electrical charge or electric field. More particularly, smart material or piezoelectric actuators have the property of exhibiting a change in size or shape when subjected to an electrical charge. Stated another way, smart material or piezoelectric actuators exhibit mechanical deformation when an electrical change is exerted on them. A smart material actuator 120 is bonded via adhesive or otherwise coupled to at least one surface of deformable substrate 118. In an embodiment hereof, smart material actuator 120 is formed from a macro fiber composite (MFC) material or an electroactive polymer (EAP). When an electrical charge is applied to smart material actuator 120, smart material actuator 120 deforms and bends as shown in FIG. 10B, thereby also bending the portion of deformable substrate 118. The operation of smart material or piezoelectric actuators to output force and deformation based on an input electrical signal is well known to those skilled the art. Piezoelectric material can be made very thin and small, thereby allowing its use in compact housings that are typical for portable electronic devices.

In order to apply an electrical charge to smart material actuator 120, haptic feedback system 100 includes control hardware and software that provide electric signals to smart material actuator 120 causing smart material actuator 120 to induce desired motion of deformable substrate to produce haptic feedback or effects to a user. More particularly, haptic feedback system 100 includes a power source for supplying an electrical charge to smart material actuator 120 and haptic feedback system 100 also includes host processor 104 and/or local processor 112 which controls the power source and thus determines the magnitude and frequency of the applied electrical charge. Accordingly, the power source is configured to receive a control signal from host processor 104 and/or local processor 112 and is configured to apply an electrical charge to smart material actuator in accordance with the control signal received from host processor 104 and/or local processor 112. The power source may be located within haptic peripheral 102 or host computer 104. Smart material actuator 120 deforms or bends in response to the applied electrical charge from the power source. With deformable substrate 118 coupled to smart material actuator 120, any forces and/or deformation produced by smart material actuator 120 are directly applied to deformable substrate 118. The portion of deformable substrate 118 coupled to smart material actuator 120 is also bent or deformed in conjunction with smart material actuator 120. With smart material actuator 120 integrated into or onto deformable substrate 118, deformable substrate 118 thus deforms without consuming power. Thus, smart material actuator 120 deforms deformable substrate 118 relative to housing 116 in response to the control signal from host processor 104 and/or local processor 112 to thereby provide a haptic effect to a user of haptic peripheral 102.

The haptic effect, i.e., deformation of deformable substrate 118, may be considered a deformation haptic effect. As used herein, "deformation" haptic effects include effects in which the smart material actuator applies force directly to the deformable substrate to bend, deform, or otherwise move the deformable substrate, thereby resulting in deformation haptic effects that are felt by the user. Deformation haptic effects as produced by embodiments hereof are felt by the user because the smart material actuator directly drives, deforms, or otherwise moves the deformable substrate which is in direct contact with user. Examples of deformation haptic effects include a jolt via a single relatively large deformation in conjunction with a virtual button press or collisions between virtual elements, or vibrations via multiple relatively small deformations in conjunction with movement of virtual elements across the screen, or other types of screen movements. Additional examples of deformation haptic effects include a heartbeat haptic effect in which the deformation of smart material actuator 120 and deformable substrate 118 follows the pattern of a heartbeat signal, in both magnitude and frequency, and/or a breathing haptic effect in which deformation of smart material actuator 120 and deformable substrate 118 follows the pattern of a small living animal which is breathing in your hand in a virtual reality environment. Such haptic feedback or effects allows for a more intuitive, engaging, and natural experience for the user of haptic feedback system 100 and thus interaction between the user and haptic feedback system 100 is considerably enhanced through the tactile feedback provided by the haptic effects.

Figure 5:
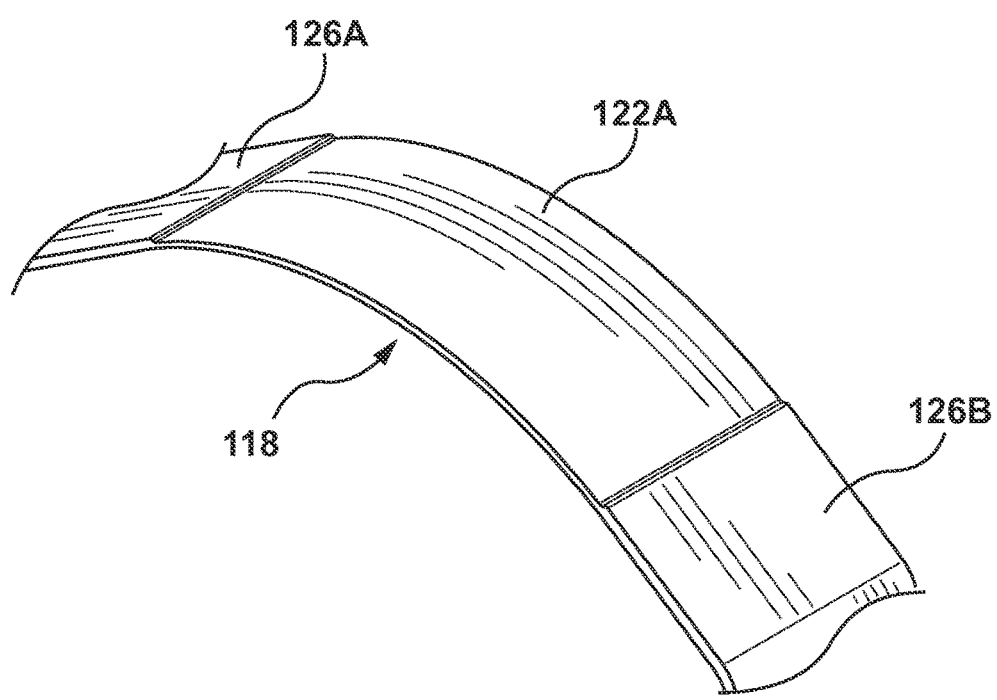
FIG. 5 is a perspective view of a portion of the deformable substrate of FIG. 4.

Deformable substrate 118 is configured to maximize or harness the force output by smart material actuator 120 and amplify or increase the deformation of the deformable substrate 118. More particularly, as best shown in FIG. 4 which is a cross-section of deformable substrate 118, deformable substrate 118 includes or is made of a series of integral or continuous portions having varying stiffnesses that are configured through nonlinear dynamics design to amplify deformation of deformable substrate 118. FIG. 5 is a perspective view of approximately half of deformable substrate 118. In the embodiment of FIGS. 4-5, deformable substrate 118 includes two opposing user contact portions 122A, 122B, collectively referred to herein as user contact portions 122. User contact portions 122 are each configured to contact the user, i.e., user contact portions 122A, 122B extend through windows or openings 117A, 117B, respectively, of housing 116 and are positioned to contact a user's hand when haptic peripheral 102 is grasped or held by the user. Deformable substrate 118 also includes two opposing rounded corners or hinges 124A, 124B, collectively referred to herein as hinges 124. Hinges 124 are each positioned between opposing user contact portions 122A, 122B. Deformable substrate 118 also includes four stiff arms 126A, 126B, 126C, 126D, collectively referred to herein as stiff arms 126. Stiff arm 126A extends between user contact portion 122A and hinge 124A, stiff arm 126B extends between user contact portion 122A and hinge 124B, stiff arm 126C extends between user contact portion 122B and hinge 124A, and stiff arm 126D extends between user contact portion 122B and hinge 124B. Although separately described herein for sake of description only, user contact portions 122, hinges 124, and stiff arms 126 are continuous integral portions of a single component, i.e., deformable substrate 118 and collectively form the oval shape of deformable substrate 118.

Deformable substrate 118 is designed or configured to amplify deformation on its surface at least up to 100 times relative to the deformation of smart material actuator 120 alone. More particularly, stiff arms 126 are relatively stiffer than user contact portions 122 and hinges 124 such that stiff arms 126 are configured to harness or generate the maximum force output by smart material actuator 120 (which is positioned on one or more surfaces of deformable substrate 118 as will be described in more detail herein) and increase the deformation of deformable substrate 118 relative to housing 116. In order to vary the stiffness of stiff arms 126 relative to user contact portions 122 and hinges 124, the geometry and/or the Young or elastic modulus of stiff arms 126 is varied. In an embodiment best shown in FIG. 4, in order to make stiff arms 126 relatively stiffer than user contact portions 122 and hinges 124, the geometry of stiff arms 126 is varied by increasing the thickness thereof compared to the thickness of user contact portions 122 and hinges 124. In the embodiment of FIGS. 4-5, user contact portions 122 have a thickness of $T_1$ which may range between 0.5 mm and 1.5 mm, hinges 124 have a thickness of $T_2$ which may range between 0.5 mm and 1.5 mm, and stiff arms 126 have a thickness of $T_3$ which may range between 1 mm and 2 mm. In another embodiment, stiff arms 126 are at least 30% thicker than each of user contact portions 122 and hinges 124. However, the specific dimensions may vary depending upon material selection, actuation type, and geometry of the deformable substrate.

In another embodiment hereof, as an alternative to or in addition to varying the geometry of stiff arms 126, the Young modulus of stiff arms 126 is varied in order to make stiff arms 126 relatively stiffer than user contact portions 122 and hinges 124. In an embodiment, stiff arms 126 may be formed from a first material which is stiffer than a second or different material of user contact portions 122 and hinges 124. For example, stiff arms 126 may be formed from Carbon Fiber while the remaining portions of deformable substrate 118, i.e., user contact portions 122 and hinges 124, are formed from Glass Fiber which has a lower stiffness than Carbon Fiber. As such, in this embodiment, deformable substrate 118 is a multi-composite substrate. When stiff arms 126 are formed from a different material having a higher stiffness than the remaining portions of deformable substrate 118, stiff arms 126 may be thicker, thinner, or the same thickness as user contact portions 122 and hinges 124 while still being stiffer due to the different material properties. In another embodiment, stiff arms 126, user contact portions 122 and hinges 124 are all formed from the same material but only stiff arms 126 undergoes a processing step to increase the stiffness thereof. For example, stiff arms 126 may be subjected to a heat treatment such as heat tearing in order to increase the Young modulus and stiffness thereof.

Due to the increased stiffness of stiff arms 126 relative to user contact portions 122 and hinges 124 as well as the overall shape and stiffness of deformable substrate 118, the deformation of user contact portions 122 relative to housing 116 via smart material actuator 120 is increased by a ratio of at least 100:1 (compared to deformation of smart material actuator 120 alone). More particularly, when smart material actuators 120 are coupled to one or more surfaces of user contact portions 122 as described herein with respect to FIGS. 6-8, deformable substrate 118 is configured to amplify or increase the deformation of user contact portions 122. As described above, deformable substrate 118 includes stiff arms 126 that are relatively stiffer than user contact portions 122 and hinges 124 as described above. As such, the stiffness of deformable substrate 118 is relatively increased along a portion thereof in which it is desired to harness or generate the maximum force output by smart material actuator 120 and the stiffness of deformable substrate 118 is relatively decreased along portions thereof in which it is desired to harness or generate the maximum deformation caused by smart material actuator 120. Furthermore, the effective stiffness of the entire deformable substrate 118 configured to amplify or increase the deformation of user contact portions 122. More particularly, stiff arms 126 and hinges 124 operate similar to a cantilever beam such that maximum deformation or deflection thereof occurs at user contact portions 122 (which are disposed at the free end of the cantilever beam). Stiff arms 126 harness or generate a maximum force output by smart material actuator 120 (due to being relatively stiffer than other portions of deformable substrate 118), and transmits the maximum force to hinges 124. Hinges 124 and user contact portions 122 harness or generate the maximum deformation by smart material actuator 120 (due to being relatively less stiff than stiff arms 126). Hinges 124 are shaped or curved in order to be compliant and to operate similar to a cantilever beam as described above, and thus the greatest or highest amount of deformation/deflection occurs at user contact portions 122. Stated another way, the overall oval shape of deformable substrate 118 means that increased or amplified deformation occurs at user contact portions 122 thereof.

Although described herein with two opposing user contact portions 122 that extend through windows or openings 117A, 117B, respectively, of housing 116 and are positioned to contact a user's hand when haptic peripheral 102 is grasped or held by the user, housing 116 may be modified to cover or extend over one of the user contact portions such that the user contacts only one user contact portion 122 of the deformable substrate. For example, haptic peripheral 102 may be modified to lay flat on a surface and a user's hand (i.e., finger or palm) extends over or contacts the "top" of the haptic peripheral having a single exposed user contact portion. Thus, in an embodiment, only the "top" half of the oval shape of deformable substrate 118 is exposed and accessible to the user while the "bottom" half of the oval shape of deformable substrate 118 is covered or disposed within the housing and thus not accessible to the user. In another embodiment, rather than being shaped into an oval shape, the deformable substrate may be a parallelogram shaped into a curve similar to the shape shown in FIG. 5 and the entire curve may be incorporated onto a haptic peripheral to extend away from an outer surface thereof. Stated another way, the deformable substrate is not required to have an oval cross-section but rather may be a curved substrate that extends away from an outer surface of a haptic peripheral.

Figure 6:
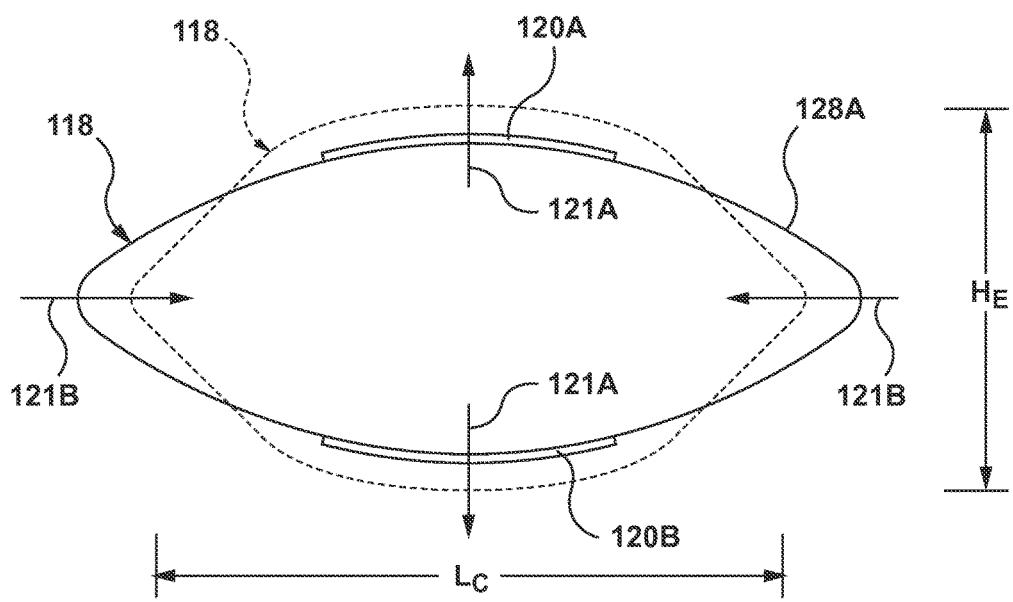
FIG. 6 is a schematic illustration of deformation of the deformable substrate of FIG. 4, wherein smart material actuators are positioned on opposing exterior surfaces of user contact portions of the deformable substrate.

The direction of deformation of deformable substrate 118, and therefore the haptic effects output to the user, varies depending upon placement of smart material actuator 120. In an embodiment hereof, a first smart material actuator 120A is coupled to user contact portion 122A and a second smart material actuator 120B is coupled to user contact portion 122B. For example, FIG. 6 is a schematic illustration of deformation of deformable substrate 118 (deformation of the deformable substrate is shown in dashed lines) when smart material actuators 120A, 120B are positioned on an exterior surface 128A of user contact portions 122A, 122B, respectively, of deformable substrate 118. When smart material actuators 120 develop an electric charge and bend in response thereto, a height of deformable substrate 118 expands from nominal or first height $H_O$ (see FIG. 4) to an expanded or second height $H_E$ (see FIG. 6) and a width or length of deformable substrate 118 contracts from a nominal or first width or length $L_O$ (see FIG. 4) to a contracted or second width or length $L_C$ (see FIG. 6). Stated another way, a height of deformable substrate 118 expands as indicated by directional arrows 121A and a width/length of deformable substrate 118 contracts as indicated by directional arrows 121B when smart material actuators 120A, 120B coupled to the exterior of the deformable substrate bend or deform. Although FIG. 6 illustrates simultaneous actuation of both smart material actuators 120A, 120B, each smart material actuator is configured to be actuated independently to selectively provide directional and independent deformation of only a portion of deformable substrate 118. As described above, due to relatively stiffer stiff arms 126 of deformable substrate 118, deformation of user contact portions 122 is amplified or increased to provide haptic effects to a user in contact with the user contact portions of the deformable substrate.

Figure 7:
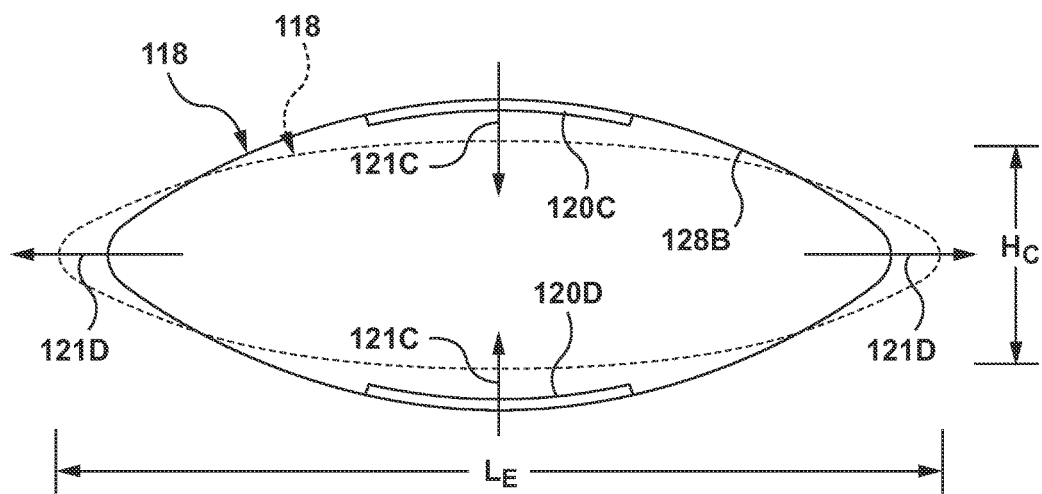
FIG. 7 is a schematic illustration of deformation of the deformable substrate of FIG. 4, wherein smart material actuators are positioned on opposing interior surfaces of user contact portions of the deformable substrate.

As another example, FIG. 7 is a schematic illustration of deformation of deformable substrate 118 (deformation of the deformable substrate is shown in dashed lines) when smart material actuators 120C, 120D are positioned on an interior surface 128B of user contact portions 122A, 122B, respectively, of deformable substrate 118. When smart material actuators 120 develop an electric charge and bend in response thereto, a height of deformable substrate 118 contracts from a nominal or first height $H_O$ (see FIG. 4) to a contracted or third height $H_C$ (see FIG. 7) and a width or length of deformable substrate 118 expands from a nominal or first width or length $L_O$ (see FIG. 4) to an expanded or third width or length $L_E$ (see FIG. 7). Stated another way, a height of deformable substrate 118 contracts as indicated by directional arrows 121C and a width/length of deformable substrate 118 expands as indicated by directional arrows 121D when smart material actuators 120D, 120D coupled to the interior of the deformable substrate bend or deform. Although FIG. 7 illustrates simultaneous actuation of both smart material actuators 120C, 120D, each smart material actuator is configured to be actuated independently to selectively provide directional and independent deformation of only a portion of deformable substrate 118. As described above, due to relatively stiffer stiff arms 126 of deformable substrate 118, deformation of user contact portions 122 is amplified or increased to provide haptic effects to a user in contact with the user contact portions of the deformable substrate.

Figure 8:
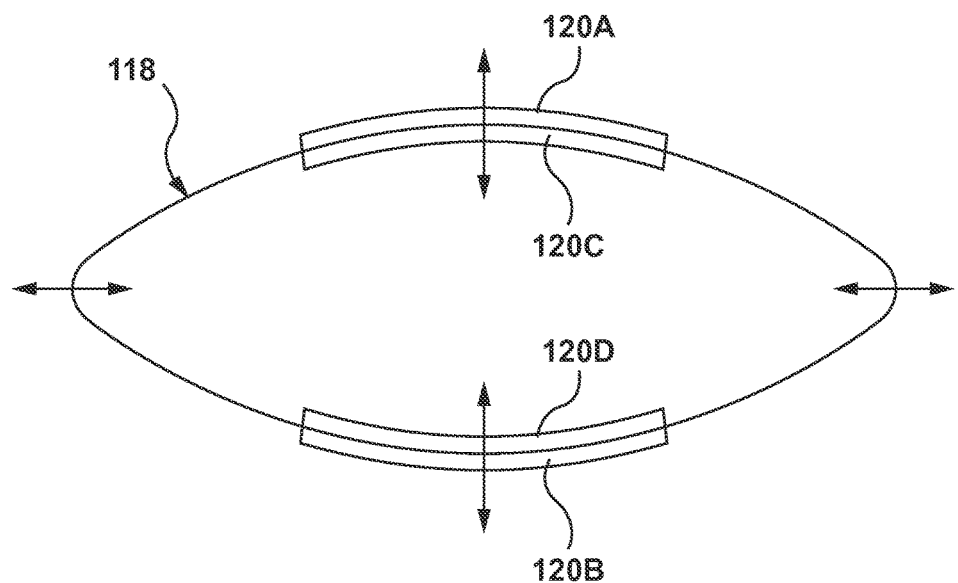
FIG. 8 is a schematic illustration of deformation of the deformable substrate of FIG. 4, wherein smart material actuators are positioned on opposing exterior surfaces and opposing interior surfaces of user contact portions of the deformable substrate.

Further, the height of deformable substrate 118 may be configured to selectively expand as shown in FIG. 6 and contract as shown in FIG. 7. Stated another way, the embodiments of FIG. 6 and FIG. 7 are not mutually exclusive. For example, FIG. 8 is a schematic illustration of deformable substrate 118 when smart material actuators 120A, 120B, 120C, 120D are positioned on both exterior and interior surfaces 128A, 128B of user contact portions 122A, 122B, respectively, of deformable substrate 118. Each smart material actuator is configured to be actuated independently to selectively provide directional and independent deformation of only a portion of deformable substrate 118 so that each user contact portion 122A, 122B may be selectively expanded and contracted. As described above, due to relatively stiffer stiff arms 126 of deformable substrate 118, deformation of user contact portions 122 is amplified or increased to provide haptic effects to a user in contact with the user contact portions of the deformable substrate.

Figure 9:
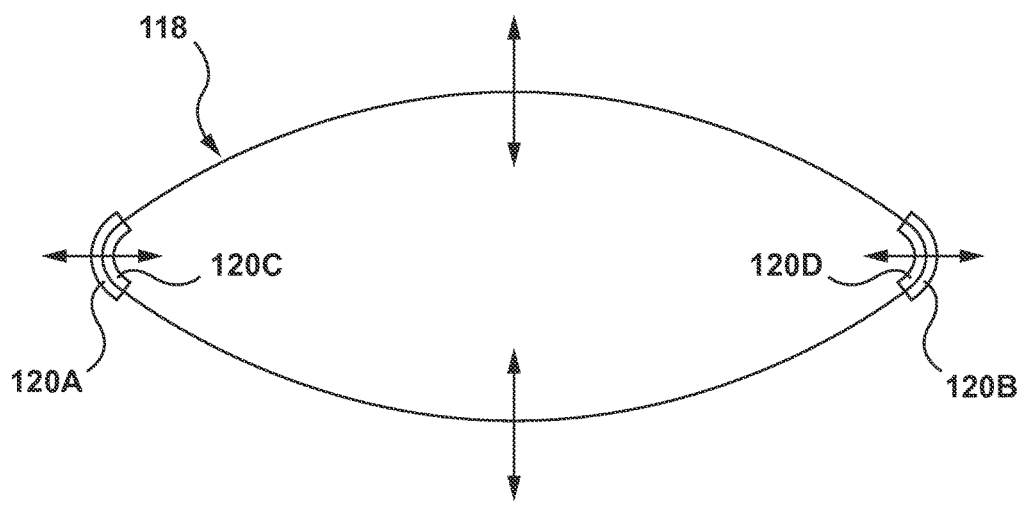
FIG. 9 is a schematic illustration of deformation of the deformable substrate of FIG. 4, wherein smart material actuators are positioned on opposing exterior surfaces and opposing interior surfaces of hinges of the deformable substrate.

Although the above embodiments depict smart material actuators 120 positioned along or on user contact portions 122 of deformable substrate 118, in another embodiment hereof one or more smart material actuators 120 may be positioned along or one hinges 124 of deformable substrate 118. For example, FIG. 9 is a schematic illustration of deformable substrate 118 when smart material actuators 120A, 120B, 120C, 120D are positioned on both exterior and interior surfaces 128A, 128B of hinges 124A, 124B, respectively, of deformable substrate 118. Each smart material actuator is configured to be actuated independently to selectively provide directional and independent deformation of only a portion of deformable substrate 118 so that each hinge may be selectively expanded and contracted. Positioning smart material actuators 120A, 120B, 120C, 120D on hinges 124 as opposed to user contact portions 122 result in different characteristics of the haptic effect which is to be output (e.g. magnitude, frequency, duration, etc.) by smart material actuator 120. Positioning smart material actuators 120A, 120B, 120C, 120D on hinges 124 as opposed to user contact portions 122 may require adjustment of the arc or curvature of hinges 124.

Figure 11:
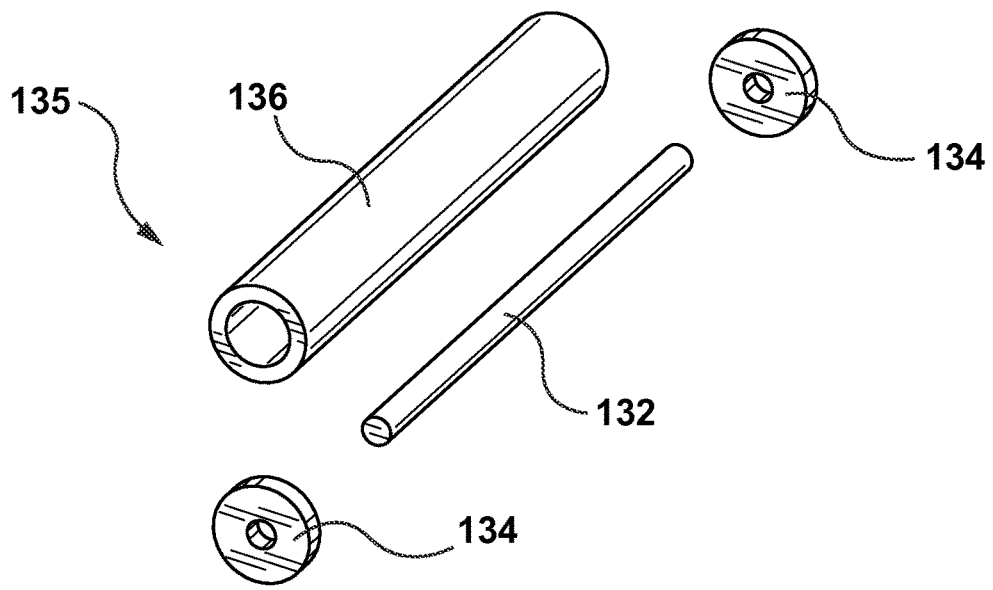
FIG. 11 is an exploded perspective view of a coupling mechanism of FIG. 3, wherein the coupling mechanism is utilized to couple the deformable substrate to a housing such that the deformable substrate is moveable relative thereto.

With reference to FIG. 3, each hinge 124 of deformable substrate 118 is coupled to housing 116 via a coupling mechanism 135 which is configured to couple the deformable substrate to the housing such that the deformable substrate is moveable relative thereto and thus is permitted to deform in response to smart material actuation as described above. FIG. 11 illustrates an exploded perspective view of a coupling mechanism 135. Each coupling mechanism 135 includes a rod 132, a compressible substance 136 circumferentially surrounding rod 132, and a plurality of washers 134. Washers 134 attach rod 132 to housing 116 so that the rod is not moveable with respect to the housing. Rod 132 extends within deformable substrate 118 such that rod 132 is adjacent to or alongside hinge 124 but is not in direct contact with hinge 124. More particularly, rod 132 is spaced apart from interior surface 128B of deformable substrate 118 by a gap or distance 138. Gap 138 is filled by compressible substance 136 such that compressible substance 136 extends between hinge 124 and rod 132. Compressible substance 136 permits movement and deformation of deformable substrate 118. More particularly, when smart material actuators 120 develop an electric charge and bend in response thereto, deformable substrate 118 also deforms in response thereto as described above with respect to FIGS. 6-9 and compressible substance 136 compresses or expands to permit deformation of deformable substrate 118. Compressible substance 136 may be, for example, a gel or foam material such as but not limited to a silicone foam, a silicone sponge, silicone rubber, PORON (polyurethane), or Buna-N. However, when no forces are applied to deformable substrate 118 (i.e., when smart material actuators 120 are not bent), deformable substrate 118 has elastic properties to resiliently return to its nominal or preset configuration or position as shown in FIG. 4. Stated another way, deformable substrate 118 resumes its nominal or preset oval shape when no force is applied to the deformable substrate via smart material actuators 120.

As previously stated, haptic peripheral 102 includes general haptic output device 130 in addition to smart material actuators 120. As shown in the sectional view of FIG. 3, general haptic output device 130 is positioned within housing 116 and is configured to provide vibrational haptic effects to the user in addition to the deformation haptic effects provided by smart material actuators 120. General haptic output device 130 serves to provide the entire housing of haptic peripheral 102 with general or rumble haptic feedback. Thus, general haptic output device 130 may be considered a rumble actuator that is configured to receive a second control signal from host processor 104 and/or local processor 112 and output a second haptic effect to housing 116 in response to the second control signal. General haptic output device 130 receives control signals from host processor 104 and/or local processor 112 based on high level supervisory or streaming commands from host computer 104. For example, when in operation, voltage magnitudes and durations are streamed from host computer 104 to haptic peripheral 102 where information is provided to general haptic output device 130 via local processor 112. Host computer 104 may provide high level commands to local processor 112 such as the type of haptic effect to be output (e.g. vibration, jolt, detent, pop, etc.) by general haptic output device 130, whereby the local processor 112 instructs general haptic output device 130 as to particular characteristics of the haptic effect which is to be output (e.g. magnitude, frequency, duration, etc.). General haptic output device 130 may include electromagnetic motors, eccentric rotating mass ("ERM") actuators in which an eccentric mass is moved by a motor, linear resonant actuators ("LRAs") in which a mass attached to a spring is driven back and forth, vibrotactile actuators, other suitable types of actuating devices. General haptic output device 130 is implemented as an inertial actuator to provide vibrotactile feedback to the user. Thus, smart material actuators 120 provide a variety of deformation haptic effects or sensations to the user that are independent of and complementary to general or rumble haptic feedback produced by general haptic output device 130.

Figure 12:
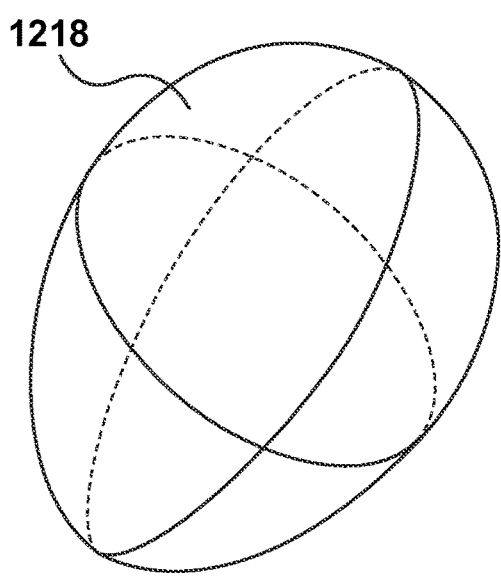
FIG. 12 is a perspective of a deformable substrate according to another embodiment hereof, wherein the deformable substrate is an ovoid.

FIG. 12 illustrates another embodiment of a deformable substrate that may be utilized in embodiments hereof. Rather than being a strip or parallelogram shaped into an oval shape, deformable substrate 1218 is an ovoid or a three-dimensional oval shape having an oval cross-section. While deformable substrate 118 includes only two opposing user contact portions or deformation regions, the ovoid shape of deformable substrate 1218 provides a plurality of or more than two deformation regions.

As previously stated, haptic peripheral 102 is merely an exemplary embodiment of a haptic peripheral and that haptic peripherals with other configurations, shapes, and sizes may be used. For example, FIGS. 13-15 illustrate another embodiment of a haptic peripheral 1302 that may be utilized in embodiments hereof. FIGS. 13 and 14 are different perspective views of haptic peripheral 1302, wherein the haptic peripheral is a handheld gaming controller, while FIG. 15 illustrates a block diagram of haptic peripheral 1302 used in a gaming system 1300 that further includes host computer 104. A housing 1316 of haptic peripheral 1302 is shaped to easily accommodate two hands gripping the device, either by a left-handed user or a right-handed user, and deformable substrates 1318 having smart material actuators 1320 coupled thereto (shown on the block diagram of FIG. 15) are incorporated into housing 1316 in a location where a hand or palm of the user is generally located to provide deformation haptic effects to the user. Deformable substrate 1318 is a parallelogram shaped into an oval shape similar to deformable substrate 118 described above, with only the "top" half of the oval shape of deformable substrate 1318 exposed and accessible to the user while the "bottom" half of the oval shape of deformable substrate 1318 is covered or disposed within housing 1316 and thus not accessible to the user. In another embodiment, deformable substrate 1318 is a parallelogram shaped into a curve similar to the shape shown in FIG. 5 and the entire curve may be incorporated onto haptic peripheral 1302 to extend away from an outer surface thereof. Those skilled in the art would recognize that haptic peripheral 1302 is merely an exemplary embodiment of a controller of similar shape and size to many "gamepads" currently available for video game console systems, and that controllers with other configurations of user input elements, shapes, and sizes may be used, including but not limited to controllers such as a Wii™ remote or Wii™ U Controller, Sony® SixAxis™ controller or Sony® Wand controller, an Xbox™ controller or similar controller, as well as controllers shaped as real life objects (such as tennis rackets, golf clubs, baseball bats, and the like) and other shapes.

Haptic peripheral 1302 includes several user input elements or manipulandums, including a joystick 1340, a button 1342, and a trigger 1346. As used herein, user input element refers to an interface device such as a trigger, button, joystick, or the like, which is manipulated by the user to interact with host computer 104. As can be seen in FIGS. 13-15 and known to those skilled in the art, more than one of each user input element and additional user input elements may be included on haptic peripheral 1302. Accordingly, the present description of a trigger 1346, for example, does not limit haptic peripheral 1302 to a single trigger. Further, the block diagram of FIG. 5 shows only one (1) of each of joystick 1340, button 1342, and trigger 1346. However, those skilled in the art would understand that multiple joysticks, buttons, and triggers, as well as other user input elements, may be used, as described above.

As can be seen in the block diagram of FIG. 15, haptic peripheral 1302 includes a targeted actuator or motor to directly drive each of the user input elements thereof as well as one or more general or rumble haptic output devices 1330 coupled to housing 1316. More particularly, joystick 1340 includes a targeted actuator or haptic output device 1350 coupled thereto, button 1342 includes a targeted actuator or haptic output device 1352 coupled thereto, and trigger 1346 includes a targeted actuator or haptic output device 1356 coupled thereto. In addition to a plurality of targeted actuators, haptic peripheral 1302 includes a position sensor coupled to each of the user input elements thereof. More particularly, joystick 1340 includes a position sensor 1341 coupled thereto, button 1342 includes a position sensor 1343 coupled thereto, and trigger 1346 includes a position sensor 1347 coupled thereto. Local processor 1312 is coupled to targeted haptic output devices 1350, 1352, 1356 as well as position sensors 1341, 1343, 1347 of joystick 1340, button 1342, and trigger 1346, respectively. As will be understood by one of ordinary skill in the art, in response to signals received from position sensors 1341, 1343, 1347, local processor 1312 instructs targeted haptic output devices 1350, 1352, 1356 to provide directed or targeted effects directly to joystick 1340, button 1342, and trigger 1346, respectively. Such targeted effects are discernible or distinguishable from general or rumble haptic effects produced by general haptic output device 1330 along the entire body of haptic peripheral 1302. Local processor 1312 may retrieve the type, magnitude, frequency, duration, or other characteristics of the haptic effect from a memory 1314 coupled to local processor 1312. The collective haptic effects provide the user with a greater sense of immersion to the game as multiple modalities are being simultaneously engaged, e.g., video, audio, and haptics.

FIGS. 16-17 illustrate another embodiment hereof in which the haptic peripheral is a gaming tablet controller 1602 that may be used with a tablet computer 1604. Tablet computer 1604 may be designed specifically for gaming activities, such as is available from Razer Inc., or may be a tablet computer well known and available in the market, such as an Apple® Ipad®, Kindle® Fire®, and Samsung® Galaxy Tab®. Gaming tablet controller 1602 includes a docking portion 1660 configured to receive tablet computer 1604 and handles 1662, 1664 with user input elements disposed thereon for a user to control a game on tablet computer 1604. Docking portion 1660 connects gaming tablet controller 1602 to tablet computer 1604 such that actions by the user on handles 1662, 1664 such as pressing buttons, moving joysticks, pressing triggers, etc., result in actions on the game being played on tablet computer 1604. Handles 1662, 1664 of haptic peripheral 1602 are shaped to easily accommodate two hands gripping the device, either by a left-handed user or a right-handed user, and deformable substrates 1618 having smart material actuators 1620 coupled thereto (shown on the block diagram of FIG. 17) are incorporated onto handles 1662, 1664 in a location where a hand or palm of the user is generally located to provide deformation haptic effects to the user. Deformable substrates 1618 are each a parallelogram shaped into an oval shape similar to deformable substrate 118 described above, with only the "top" half of the oval shape of each deformable substrate 1618 exposed and accessible to the user while the "bottom" half of the oval shape of each deformable substrate 1618 is covered or disposed within handles 1662, 1664 and thus not accessible to the user. In another embodiment, each deformable substrate 1618 is a parallelogram shaped into a curve similar to the shape shown in FIG. 5 and the entire curve may be incorporated onto handles 1662, 1664 of haptic peripheral 1602 to extend away from an outer surface thereof.

Handles 1662, 1664 include typical user input elements found on controllers. The user input elements will be described with respect to handle 1664. However, those skilled in the art would recognize that the same or similar user input elements may be used on handle 1662. In particular, handle 1664 includes a joystick 1640, a button 1642, and a trigger 1646. As can be seen in FIG. 16 and known to those skilled in the art, more than one of each of these user input elements may be included on each handle 1662, 1664. Further, handle 1664 includes a general or rumble haptic output device 1630 attached thereto for providing general or rumble haptic effects to gaming tablet controller 1602 as described above with respect to general or rumble haptic output device 1630.

FIG. 17 illustrates a block diagram of the gaming tablet controller of FIG. 16 in accordance with an embodiment. As shown in FIG. 17, gaming tablet controller 1602 includes a local processor 1612 which communicates with tablet computer 1604 via a docking portion 1660. Other connections, such as wired or wireless connections, may be used instead of docking portion 1660. Tablet computer 1604 in this embodiment includes a display screen. Gaming tablet controller 1602 may be alternatively configured to not include local processor 1612, whereby all input/output signals from gaming tablet controller 1602 are handled and processed directly by tablet computer 1604.

Local processor 1612 is coupled to joystick 1640, button 1642, and trigger 1646, and to position sensors 1641, 1643, and 1647 that may be coupled to joystick 1640, buttons 1642, and trigger 1646, respectively. The block diagram of FIG. 17 shows only one (1) of each of joystick 1640, button 1642, and trigger 1646. However, those skilled in the art would understand that multiple joysticks, buttons, and triggers, as well as other user input elements, may be used, as described above. Targeted actuators or haptic output devices 1650, 1652, 1656 are coupled to joystick 1640, button 1642, and trigger 1646, respectively. Targeted haptic output devices 1650, 1652, 1656 and general haptic output device 1630 are also coupled to local processor 1612, which provides control signals to the haptic output devices 1650, 1652, 1656, 1630 based on high level supervisory or streaming commands from tablet computer 1604. In the streaming embodiment, the voltage magnitudes and durations are streamed to gaming tablet controller 1602 where information is provided by the tablet computer 1604 to the actuators. In operation, tablet computer 1604 may provide high level commands to the local processor 1612 such as the type of haptic effect to be output (e.g. vibration, jolt, detent, pop, etc.) by one or more selected actuators, whereby local processor 1612 instructs the actuator as to particular characteristics of the haptic effect which is to be output (e.g. magnitude, frequency, duration, etc.). Local processor 1612 may retrieve the type, magnitude, frequency, duration, or other characteristics of the haptic effect from a memory 1614 coupled to local processor 1612. The haptic effects provide the user with a greater sense of immersion to the game as multiple modalities are being simultaneously engaged, e.g., video, audio, and haptics.

Figure 18:
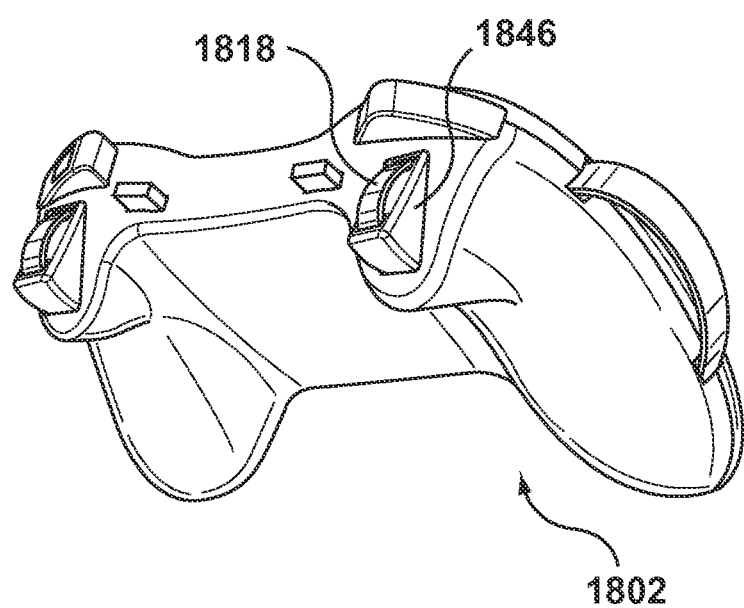
FIG. 18 is a perspective view of a haptic peripheral according to another embodiment hereof, wherein the haptic peripheral is a gaming controller that includes a deformable substrate incorporated onto a trigger user input element for providing haptic effects to a user.

In addition to the gamepad configuration of FIGS. 13-15 and tablet configuration of FIGS. 16-17, deformable substrates having smart material actuators coupled thereto as described herein may be incorporated into any type of haptic peripheral in a location where a hand or finger of the user is generally located to provide deformation haptic effects to the user. In addition, deformable substrates having smart material actuators coupled thereto as described herein may be incorporated onto touch screen(s) to provide deformation haptic effects to the user, buttons of electronic devices to provide deformation haptic effects to a finger of the user, computer input devices such as a mouse or touchpad to provide deformation haptic effects to a palm or finger of the user, or wearable peripherals to provide deformation haptic effects to the body of the user. The scale and relative dimensions of the deformable substrate will vary depending upon application, i.e., depending upon whether the deformable substrate is configured to contact a user's finger, a user's palm, or a different portion of a user's body. In an embodiment, deformable substrates having smart material actuators coupled thereto as described herein are incorporated onto a user input device, i.e., a trigger, a button, or a joystick, that is configured to move and/or receive an input from a user. For example, as shown on a haptic peripheral 1802 on FIG. 18, if a deformable substrate 1818 having smart material actuators coupled thereto as described herein is incorporated onto a trigger 1846, deformation haptic effects may be output to the user when the user pulls trigger 1846. Deformable substrate 1818 is a parallelogram shaped into an oval shape similar to deformable substrate 118 described above, with only the "top" half of the oval shape of deformable substrate 1818 exposed and accessible to the user while the "bottom" half of the oval shape of deformable substrate 1818 is covered or disposed within trigger 1846 and thus not accessible to the user. In another embodiment, deformable substrate 1818 is a parallelogram shaped into a curve similar to the shape shown in FIG. 5 and the entire curve may be incorporated onto trigger 1846 of haptic peripheral 1802 to extend away from an outer surface thereof.

When deformable substrates having smart material actuators coupled thereto as described herein are incorporated onto a user input device, i.e., a trigger, a button, or a joystick, the deformation haptic effects may vary or be modified according to input from a sensor such as position sensors 1341, 1343, 1347, 1641, 1643, 1647 described above that are coupled to an individual user input element. A position or pressure sensor may be configured to measure the input force or pressure exerted onto a user input element, and the local processor and/or host processor may vary the deformation haptic effects according to the sensor input. For example, the deformation haptic effect may be stronger or relatively increased if the sensor input indicates or detects that a user is pressing harder on the user input element. In another example, a user may apply force or pressure to a user input element and receive a deformation haptic effect as the force or pressure crosses various thresholds.

While various embodiments according to the present invention have been described above, it should be understood that they have been presented by way of illustration and example only, and not limitation. For example, although the deformable substrate is described herein with smart material actuators, embodiments hereof may utilize electromagnetic actuators for bending and deforming the deformable substrate. Regardless of the type of actuator utilized, the deformable substrate is designed or configured to amplify deformation on its surface at least up to 100 times relative to the deformation of actuator alone. It will be apparent to persons skilled in the relevant art that various changes in form and detail can be made therein without departing from the spirit and scope of the invention. For example, although described for use in conjunction with controllers having general or rumble actuators, it will be understood by those of ordinary skill in the art that targeted actuators or motors as described herein for outputting targeted or directed haptic effects to user input elements may be used in controllers that do not include general or rumble actuators for outputting haptic effects to the housing of the controller. Thus, the breadth and scope of the present invention should not be limited by any of the above-described exemplary embodiments, but should be defined only in accordance with the appended claims and their equivalents. It will also be understood that each feature of each embodiment discussed herein, and of each reference cited herein, can be used in combination with the features of any other embodiment. All patents and publications discussed herein are incorporated by reference herein in their entirety.

What is claimed is:

1. A haptic peripheral comprising:
   a housing;
   a deformable substrate coupled to the housing and deformable relative to the housing, wherein the deformable substrate includes at least one user contact portion and two opposing hinges; and
   a smart material actuator coupled to a surface of the deformable substrate, wherein the smart material actuator is configured to receive a control signal from a processor and deforms the deformable substrate relative to the housing in response to the control signal from the processor to thereby provide a haptic effect to a user of the haptic peripheral,
   wherein the deformable substrate includes at least two stiff arms, each stiff arm extending between the user contact portion and one of the two opposing hinges, wherein the stiff arms are relatively stiffer than the user contact portion and the opposing hinges, and the deformation of the deformable substrate causes a displacement of the user contact portion from a first height to a second height, wherein the second height has a greater distance from the housing than the first height.

2. A haptic peripheral comprising:
   a housing;
   a deformable substrate coupled to the housing to be moveable thereto, wherein the deformable substrate includes at least one user contact portion and two opposing hinges; and
   a smart material actuator coupled to a surface of the deformable substrate, wherein the smart material actuator is configured to receive a control signal from a processor and is configured to deform the deformable substrate relative to the housing in response to the control signal from the processor to thereby provide a haptic effect to a user of the haptic peripheral,
   wherein the deformable substrate includes at least two stiff arms, each stiff arm extending between the user contact portion and one of the two opposing hinges, wherein the stiff arms are relatively stiffer than the user contact portion and the opposing hinges, such that the deformable substrate is configured to increase the deformation of the deformable substrate relative to the housing, and
   wherein the deformable substrate has an oval cross-section and includes two opposing user contact portions configured to contact the user and four stiff arms, each hinge of the opposing hinges being positioned between the opposing user contact portions and each stiff arm extending between each user contact portion and each hinge of the opposing hinges.

3. The haptic peripheral of claim 2, wherein the smart material actuator includes a first smart material actuator coupled to one of the opposing user contact portions and the smart material actuator includes a second smart material actuator coupled to the other of the opposing user contact portions.

4. The haptic peripheral of claim 3, wherein the first and second smart material actuators are coupled to exterior surfaces of the deformable substrate and wherein a height of the deformable substrate expands and a width of the deformable substrate contracts when the first and second smart material actuators produce a force that moves the deformable substrate relative to the housing.

5. The haptic peripheral of claim 3, wherein the first and second smart material actuators are coupled to interior surfaces of the deformable substrate and wherein a height of the deformable substrate expands and a width of the deformable substrate contracts when the first and second smart material actuators produce a force that moves the deformable substrate relative to the housing.

6. The haptic peripheral of claim 2, wherein the deformable substrate includes two parallelograms curved into the oval cross-section.

7. The haptic peripheral of claim 2, wherein the deformable substrate is ovoid shaped.

8. The haptic peripheral of claim 1, wherein the stiff arms are formed from a first material and the user contact portion and the opposing hinges are formed from a second material, the first material being different from the second material and having a higher stiffness than the second material.

9. The haptic peripheral of claim 1, wherein the stiff arms are at least 30% thicker than the user contact portion and the opposing hinges.

10. The haptic peripheral of claim 1, wherein deformation of the smart material actuator causes increased deformation of the user contact portion of the deformable substrate relative to deformation of the stiff arms of the deformable substrate.

11. The haptic peripheral of claim 1, wherein the deformable substrate is formed from a glass fiber or carbon fiber composite material and the smart material actuator is formed from a macro fiber composite material or an electroactive polymer.

12. The haptic peripheral of claim 1, wherein the deformable substrate is incorporated onto a user input element that is configured to receive an input from the user.

13. The haptic peripheral of claim 1, wherein the deformable substrate is coupled to the housing by a rod and a compressible substance that surrounds the rod and extends between the rod and the deformable substrate, the compressible substance being configured to permit the deformation of the deformable substrate relative to the housing.

14. A haptic peripheral comprising:
   a housing;
   a deformable substrate coupled to the housing and deformable relative to the housing; and
   a smart material actuator coupled to a surface of the deformable substrate, wherein the smart material actuator is configured to receive a control signal from a processor and produces a force that deforms the deformable substrate relative to the housing in response to the control signal from the processor to thereby provide a haptic effect to a user of the haptic peripheral,
   wherein at least a first portion of the deformable substrate is stiffer than a second portion of the deformable substrate, and the deformation of the deformable substrate causes a displacement of the second portion from a first height to a second height, wherein the second height has a greater distance from the housing than the first height.

15. The haptic peripheral of claim 14, wherein the deformable substrate has an oval cross-section and the smart material actuator includes a first smart material actuator coupled to a first surface of the deformable substrate and the smart material actuator includes a second smart material actuator coupled to a second surface of the deformable substrate, the second surface opposing the first surface.

16. The haptic peripheral of claim 14, wherein the first portion of the deformable substrate is at least 30% thicker than the second portion of the deformable substrate and the deformation of the second portion of the deformable substrate is increased relative to the deformation of the first portion of the deformable substrate.

17. The haptic peripheral of claim 14, wherein the first portion of the deformable substrate is formed from a first material and the second portion of the deformable substrate is formed from a second material, the first material being different from the second material and having a higher stiffness than the second material and the deformation of the second portion of the deformable substrate is increased relative to the deformation of the first portion of the deformable substrate.

18. A gaming system comprising:
a host computer;
a processor; and
a haptic peripheral including a housing, a deformable substrate coupled to the housing and deformable relative to the housing, and a smart material actuator coupled to a surface of the deformable substrate, wherein the smart material actuator produces a force that deforms the deformable substrate relative to the housing in response to a control signal received from the processor to thereby provide a haptic effect to a user of the haptic peripheral, and
wherein the deformable substrate includes at least one user contact portion, two opposing hinges, and at least two stiff arms, each stiff arm extending between the user contact portion and one of the two opposing hinges, the stiff arms being relatively stiffer than the user contact portion and the opposing hinges, and the deformation of the deformable substrate causes a displacement of the user contact portion from a first height to a second height, wherein the second height has a greater distance from the housing than the first height.

19. The gaming system of claim 18, wherein the processor is located within the housing of the haptic peripheral.

20. The gaming system of claim 19, wherein the processor is disposed in the host computer.

* * * * *